United States Patent [19]

Cedrone

[11] 4,000,798
[45] Jan. 4, 1977

[54] INERTIAL ARRESTING DEVICE FOR FEEDER

[76] Inventor: Nicholas J. Cedrone, Daymarc Corporation, 40 Bear Hill Road, Waltham, Mass. 02154

[22] Filed: July 16, 1975

[21] Appl. No.: 596,304

Related U.S. Application Data

[63] Continuation of Ser. No. 457,811, April 4, 1974, abandoned.

[52] U.S. Cl. .................................................. 193/40
[51] Int. Cl.² ........................................ B65G 11/20
[58] Field of Search ........... 193/32, 40; 243/19–28, 243/38; 53/248; 324/158 F; 209/81; 198/227; 141/88, 174, 370

[56] References Cited

UNITED STATES PATENTS

| | | | |
|---|---|---|---|
| 1,449,996 | 3/1923 | Hepperle | 243/38 |
| 2,994,420 | 8/1961 | Tobias | 193/32 |
| 3,595,283 | 7/1971 | Cornelius et al. | 141/174 |

*Primary Examiner*—Evon C. Blunk
*Assistant Examiner*—James L. Rowland
*Attorney, Agent, or Firm*—Kenway & Jenney

[57] ABSTRACT

A device for arresting a falling electronic component at a preselected retention site has a pendulum that acts in cooperation with a stop, a guide rail and a stirrup to bring the component to a bounce-free landing on a foot of the stirrup. The falling component strikes an upwardly facing surface of the pendulum causing it to rotate rapidly away from the component. The stop intercepts the backswing of the pendulum and returns it to clamp the component against the guide rail. A side edge of the pendulum provides a jamming action that restrains the component against bouncing up from the foot.

4 Claims, 4 Drawing Figures

INERTIAL ARRESTING DEVICE FOR FEEDER

This is a continuation of application Ser. No. 457,811, filed Apr. 4, 1974, now abandoned.

BACKGROUND OF THE INVENTION

This invention relates in general to inertial arresting devices and in particular to a device for bringing a free-falling object to a full stop on a fixed surface without having it bounce up from the surface. More specifically, this invention relates to a device for arresting a succession of falling integrated circuits which may be of nonuniform size and mass at a retention site in order to facilitate such operations as the attachment of test circuit contacts to each integrated circuit with accuracy and at a high repitition rate.

In the manufacture of integrated circuits (IC's) and the like it is highly desirable to test each IC for device performance. However, production economics require that the tests be performed extremely rapidly, a desirable rate being in excess of 5,000 IC's per hour. Apparatus for automatically handling and sorting IC's at these rates are well known in the art. However, to be commercially feasible, such automatic test handlers/sorters must also produce highly reliable tests and be capable of successively processing IC's having different sizes and masses (weights).

It has been found that the most effective design for the IC handling and feeding mechanisms of these apparatus utilizes a vertically oriented gravity feed arrangement that readily accommodates IC's of varying size and mass. It has also been found, however, that this arrangement results in tests that are unreliable. When the vertically falling IC's strike a fixed surface that locates them at the test site, they bounce up from the surface and cause the test circuit contacts to make a poor electrical connection with the IC, completely fail to attach to a designated pin of the IC, or attach to the wrong pin. Simply waiting for the bouncing motion to stop is not a practical solution since it lowers the rate of operation of the testing unit to a commercially unacceptable level. The use of a springloaded device to cushion the landing is likewise commercially impractical since the effect of the spring varies with the mass of the IC it acts upon. For example, if the spring is selected to break the fall of a light IC, a heavier IC nevertheless bounces on impact. Conversely, if the spring is selected for a heavy IC, a light IC does not have a sufficient momentum to reach the desired testing location.

It is therefore a principal object of this invention to provide an inertial arresting device for suddenly bringing a falling integrated circuit or the like to a complete stop on a fixed surface without allowing it to bounce up from the surface.

Another object of this invention is to provide an inertial arresting device that operates in such a manner, without adjustment, for IC's having a variety of sizes and masses.

Still another object is to provide an inertial arresting device having these characteristics that is rugged, reliable, and has a low cost of manufacture.

Yet another object is to provide such an inertial arresting device that is readily incorporated in conventional integrated circuit test handling and sorting devices.

SUMMARY OF THE INVENTION

An inertial arresting device according to this invention provides a free-swinging pendulum that acts in cooperation with a stop, a guide rail, and a stirrup to bring a falling integrated circuit or the like to a bounce-free landing on a foot of the stirrup. The falling IC strikes the pendulum and causes the pendulum to rotate rapidly away from the IC. The IC then continues to fall a short distance until it lands on the foot of the stirrup. As the IC falls the rotating pendulum strikes the stop and returns to bear against a side of the IC and thereby to provide a mild clamping action against the guide rail. If the IC has retained sufficient energy to bounce after landing on the foot, the returned pendulum holds it in position on the foot through a combination of the clamping action and a locking or jamming action.

These and other features of this invention will be fully understood from the folowing detailed description of the preferred embodiments and with reference to the accompanying drawings.

DETAILED DESCRIPTION OF THE PREFERRED EMBODIMENTS

Figure 1:
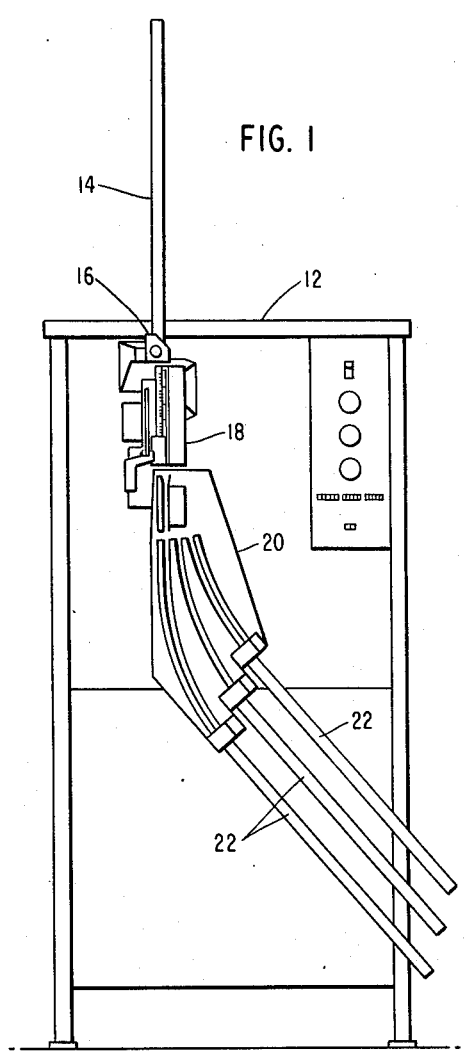
FIG. 1 is a front elevational view of an integrated circuit test handler and sorter which employs an inertial arresting device constructed in accordance with this invention.
Figure 4:
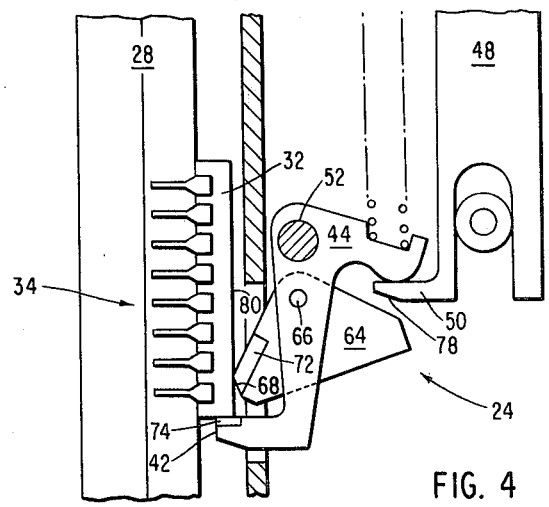
FIG. 4 is a detailed view corresponding to FIGS. 2 and 3 showing an IC in the test position with the pendulum acting to restrain the IC from bouncing up from the foot of the stirrup.

FIG. 1 shows an integrated circuit test handling and sorting apparatus 12 that receives integrated circuits (IC's) from a stick 14 held at its lower end in a stick mounting assembly 16 that also serves to direct the IC's to a feeding and testing assembly 18. The assembly 18 automatically feeds the IC's, one at a time, at a preferred rate of approximately 5,000 IC's per hour, to a test site. Each IC comes to a full stop at the test site (as illustrated in FIG. 4) for a period of approximately 100 milliseconds while a contact assembly (not shown) of well-known design connects the IC to a test circuit and the test is performed. Following the test, the IC drops to a sorter 20 which directs it to a selected output or receiving stick 22. To provide uninterrupted operation, each stick 14 or 22 is usually a tandem pair of sticks so that one stick of each pair can be replaced while the other stick continues to supply or receive IC's.

Figure 2:
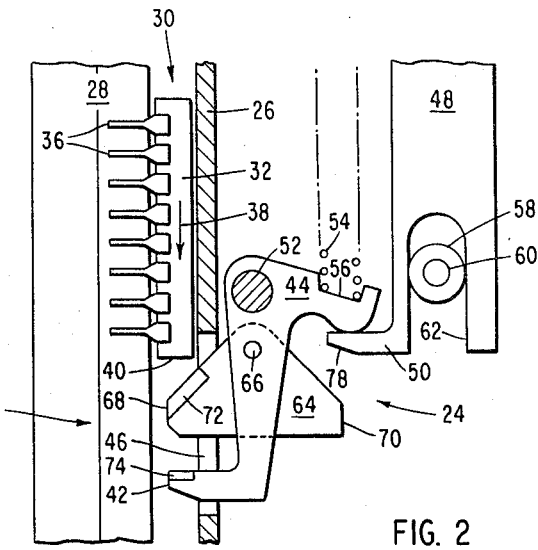
FIG. 2 is a detailed view of a preferred embodiment of the invention incorporated in the test handler and sorter shown in FIG. 1.
Figure 3:
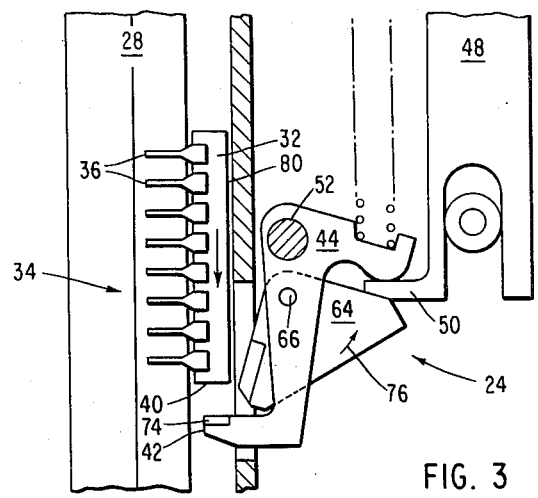
FIG. 3 is a detailed view corresponding to FIG. 2 showing the pendulum striking the stop.

FIGS. 2-4 illustrate in detil a lower portion of the assembly 18 which incorporates a preferred embodiment of an inertial arresting device 24 constructed according to this invention. An assembly housing wall 26 and a substantially parallel spaced apart rail 28 define a vertically oriented fall path or track 30 that guides a succession of IC's 32 as they fall under the influence of gravity to a retention or test site indicated generally at 34. The assembly 18 has a suitable escapement mechanism (not shown) to control the sequential downwardly movement of the IC's 32 in the track 30.

Each IC is oriented in the track 30 with two parallel rows of connecting leads or pins 36 straddling the rail 28. A slight clearance between the IC's 32 and the wall 26 and rail 28 allows the IC's to slide freely down the track 30 in the direction shown by arrow 38 (FIG. 2). The wall 26 and rail 28 are, however, sufficiently close to the IC's to restrain any significant lateral shift in position.

The falling IC 32 is automatically located at the test site 34 when its lower end surface 40 rests on the upper surface of a foot 42 of a stirrup 44. The foot 42 extends into the track 30 through a window 46 in the wall 26. When each test is completed, the vertically reciprocating plate 48 moves upwardly from the position shown. This causes the plate arm 50 to pivot the stirrup 44 on the pin 52 so that the foot 42 withdraws from the track 30 and allows the tested IC to fall to the sorter 20. A spring 54 that bears downwardly on an upper surface 56 of the stirrup 44 serves to pivot the stirrup back to its initial position (FIGS. 2-4) once the tested IC has cleared the foot 42 and the plate 48 has returned to its initial illustrated position. The spring 54 is sufficiently stiff that the impact of the IC 32 on the upper surface of the foot does not cause the foot to "give" since this would result in the IC being tossed up from the foot as the spring returns to its initial uncompressed state. A bushing 58 mounted on a threaded screw 60 and slidably engaged in an open slot 62 formed in the lower end of the plate 34 serves to support and guide the plate as it reciprocates.

With further reference to FIGS. 2-4, a principal feature of the invention is a free-swinging pendulum 64 that preferably has a generally triangular shape. The pendulum is pivotally mounted on a pin 66 that is centered in the upper portion of the pendulum. A portion of the pendulum extends through the window 46 and is positioned to intercept the IC 32 on an upwardly facing surface as it falls to the test site 34. The two bottom corners 68 and 70 are trimmed on lines substantially perpendicular to the bottom edge of the pendulum, as shown. The pendulum can be constructed from any suitable structural material such as hardened steel, but the region of impact with the IC is preferably formed from a strip 72 of a highly wear-resistant material such as tool steel. A portion 74 of the foot 42 that impacts with the IC is also preferably formed from such a highly wear-resistant material.

With reference to FIGS. 2 and 3, when the falling IC 32 strikes the pendulum it transfers a substantial portion of its kinetic energy to the pendulum. The mass and moment of inertia of the pendulum are selected so that the impact of the IC 32 causes the pendulum to rotate away from the IC, in the direction indicated by arrow 76 (FIG. 3), at a high angular velocity. The pendulum backswing continues until it strikes a stop 78 formed on the lower end of the arm 50, as shown. This collision reverses the direction of rotation causing the pendulum to return towards the track 30 until it strikes the IC 32 on its vertically oriented "top" surface 80. The impact of the pendulum clamps the IC 32 against the rail 28 and then continues to mildly clamp the IC against the track as the IC completes its fall onto the foot 42. The frictional drag induced by this clamping reduces the downward velocity of the IC 32 and therefore inhibits the IC from bouncing up from the foot. It should be noted that the vertical location of the IC 32 when it is struck by the "returned" pendulum depends on a variety of parameters which include the mass of the pendulum, the mass of the IC, the moment of inertia of the pendulum, the velocity of the IC at the time of impact with the pendulum (which is a function of the free-fall distance between the escapement release point and the point of impact with the pendulum), and the location of the stop 78 along the rotational path of the pendulum. A proper selection of these parameters ensures that the pendulum 64 will have a sufficiently high angular velocity to return to clamp and lock the IC before the IC rebounds from the foot 42.

If the IC nevertheless has sufficient kinetic energy to rebound from the foot 42, a wedging or jamming action between the surface 80 and the pendulum edge 68 formed on the exposed end of strip 72 acts to lock the IC against an upward movement. This occurs since any movement of the IC up from the foot 42 must pivot the pendulum 64 in a direction that wedges the IC move tightly between the pendulum and the rail 28. It will be understood that the effective jamming angle between the surface 80 and the edge 68 depends on the relative friction between these surfaces.

In addition to eliminating any bounce when the IC impacts on the foot 42, the above-described inertial arresting device 24 also has the advantage of operating effectively, without adjustment, with IC's having nonuniform sizes and masses. When the pendulum 64 has a properly selected mass and moment of inertia, the device 24 will arrest IC's having "light" or "normal" masses so that they have substantially no vertical velocity just after striking the pendulum. They therefore fall onto the stirrup with only the kinetic energy due to the relatively short fall between the pendulum impact point and the foot 42, reduced by the frictional drag of the pendulum clamping action. This level of energy will typically result in little or no bounce. With heavier IC's the force of impact on the foot will be significantly greater since they retain a significant downward velocity after impacting the pendulum. However, the locking feature of the invention prevents the heavy IC's from rebounding up from the stirrup.

Although this invention has been described with respect to an integrated circuit test handling and sorting device, it will be understood that the principles and features disclosed herein can be adapted to a variety of structural environments without departing from the scope of this invention. For example, the retention site described above as the test site can be adapted to other processing operations such as the application of descriptive or identifying marks. In addition, the pendulum element of this invention may assume a variety of alternative shapes and sizes. For example, the pendulum can have the form of an inverted "V" with the pivot located near the apex of the V. Further, the impact region on the pendulum can be a horizontal notch in order to eliminate any horizontal component of force on the IC as a result of the impact with the pendulum. Still further, although the stop 78 has been described as formed on an arm of the reciprocating plate 48, equivalent alternative structures include free-standing fixed pins or blocks that are positioned to intercept the pendulum in its backswing as described above. These and various other modifications of the invention will become apparent to those skilled in the art from the foregoing description and accompanying drawings. Such modifications are intended to fall within the scope of the appended claims.

What is claimed is:

1. In apparatus for successively placing discrete articles in and removing them from a first position on a support without an upward bounce from the support and at a high repetition rate and where the articles successively approach said first position in a substantially free fall from a second position substantially vertically above said first position, the combination comprising, impact retarding means positioned and adapted for a first, substantially elastic, impact by each falling article, thereby acquiring a kinetic energy variable directly with the mass of said article and a horizontal velocity component that is greater for articles of greater mass than for articles of lesser mass, friction retarding means having a substantially vertical surface adjacent the path of fall of the articles after impact and positioned so that the impact retarding means upon a second impact with the article as it falls to said first position, causes the article to bear frictionally on said surface with a force directly related to said velocity component, and a fixed abutment that reverses the direction of the horizontal velocity component of the impact retarding means.

2. The combination of claim 1 wherein said impact retarding means comprises a pivotal inertial element having its pivotal axis located with respect to its center of gravity to bias the pivotal inertial element for said frictional engagement after said second impact as it falls to said first position.

3. The combination of claim 1 wherein said frictional retarding means comprises a substantially vertical rail member that guides the articles in said free fall from said second position to said first position.

4. A combination according to claim 1 wherein said pivotal inertial element has a wedging surface that forms an acute angle with the articles when they are in said first position on said support to lock said articles against an upward movement from said support.

* * * * *